United States Patent
Matsui et al.

(10) Patent No.: US 8,101,055 B2
(45) Date of Patent: Jan. 24, 2012

(54) SPUTTERING APPARATUS AND METHOD FOR FORMING COATING FILM BY SPUTTERING

(75) Inventors: Hirotoshi Matsui, Toyota (JP); Kaoru Ito, Toyota (JP)

(73) Assignee: Kojima Press Industry Co., Ltd., Toyota-Shi (JP)

( * ) Notice: Subject to any disclaimer, the term of this patent is extended or adjusted under 35 U.S.C. 154(b) by 475 days.

(21) Appl. No.: 12/327,927

(22) Filed: Dec. 4, 2008

(65) Prior Publication Data

US 2009/0162618 A1   Jun. 25, 2009

(30) Foreign Application Priority Data

Dec. 19, 2007  (JP) ................. 2007-327000
Oct. 7, 2008  (JP) ................. 2008-260456

(51) Int. Cl.
  *C25B 9/00*  (2006.01)
  *C25B 11/00*  (2006.01)
  *C25B 13/00*  (2006.01)
  *C23C 14/00*  (2006.01)
  *C23C 16/00*  (2006.01)

(52) U.S. Cl. ......... 204/298.28; 204/298.15; 204/298.27; 118/729; 118/730

(58) Field of Classification Search ............. 204/298.23, 204/298.27, 298.15, 298.28; 118/729, 730
See application file for complete search history.

(56) References Cited

U.S. PATENT DOCUMENTS

| | | | | |
|---|---|---|---|---|
| 4,034,704 A | * | 7/1977 | Wossner et al. | 118/730 |
| 4,485,759 A | * | 12/1984 | Brandolf | 118/503 |
| 5,795,448 A | * | 8/1998 | Hurwitt et al. | 204/192.1 |
| 6,051,113 A | * | 4/2000 | Moslehi | 204/192.12 |
| 2001/0024687 A1 | | 9/2001 | Gartner | |

FOREIGN PATENT DOCUMENTS

| | | |
|---|---|---|
| JP | B-48-379 | 1/1973 |
| JP | 2003-129228 | 5/2003 |
| JP | 2003-155556 A1 | 5/2003 |
| JP | 2004-174921 A1 | 6/2004 |
| JP | 2005-068510 | 3/2005 |
| JP | 2005-179748 A1 | 7/2005 |
| WO | 2008/144236 A1 | 11/2008 |

* cited by examiner

*Primary Examiner* — Alexa Neckel
*Assistant Examiner* — Michael Band
(74) *Attorney, Agent, or Firm* — Burr & Brown

(57) ABSTRACT

A sputtering apparatus for forming a coating film made of a metallic film on a coating surface of a substrate by sputtering to have such a film thickness that gradually increases or gradually decreases from its one end side to the other end side. The apparatus comprising at least one supporting means supporting at least one substrate such that a coating surface thereof is opposed to an emission surface of a sputtering target at an angle, and at least one shielding member for preventing part of sputtering particles emitted from the emission surface from reaching the coating surface. The at least one shielding member being disposed in the vacuum chamber so as to be positioned in a space between the coating surface of the at least one substrate and the emission surface of the sputtering target.

4 Claims, 8 Drawing Sheets

SPUTTERING APPARATUS AND METHOD FOR FORMING COATING FILM BY SPUTTERING

The present application is based on Japanese Patent Application No. 2007-327000 filed on Dec. 19, 2007 and No. 2008-260456 filed on Oct. 7, 2008, the contents of which are incorporated herein by reference.

BACKGROUND OF THE INVENTION

1. Field of the Invention

The present invention relates to a sputtering apparatus, a method for forming a coating film by sputtering, and a decorated product, and in particular, to a sputtering apparatus capable of advantageously forming a coating film made of a metallic film on a surface of a substrate by sputtering, an advantageous method for forming such a coating film, and a decorated product in which such a coating film is formed on the substrate.

2. Description of the Related Art

Conventionally, decorated products each provided with decoration that provides a metallic surface in appearance by forming a metallic coating film on a substrate comprised of a resin molded article or the like have been broadly used, for example, as skin materials or parts of various products and items such as automobile interior parts, furniture, building materials, home electric appliances, and mobile electronic apparatuses, as alternatives to real metal products.

Such a decorated product is generally produced by forming a coating film or an ink layer comprised of metallic paint or a metallic ink on a coating surface (for example, design surface) of the substrate on which a coating film is to be formed by coating, printing or the like, or produced by plating the coating surface. However, a decorated product having a metallic coating film or a metallic ink layer formed on its coating surface contains a resin material in the coating film or the ink layer. Therefore, it is inevitable that such a decorated product is inferior in brightness compared to real metal. Furthermore, in a decorated product having a plating film formed on a coating surface of a substrate, the plating film is formed to have a relatively large film thickness ranging from several tens micrometers to several hundreds micrometers. Therefore, in such a plated product, a corner part or an edge has a rounded shape, and hence a sharply angular shape of a corner part or an edge of a metallic product is not obtained in the plated product. Therefore, it was difficult to sufficiently obtain a metallic surface that provides a real metallic surface satisfactorily by any of decorated products having a metallic coating film, metallic ink layer, plating film or the like on a coating surface of a substrate.

Under such a circumstance, a technique of obtaining a decorated product by forming a coating film made of a metallic film by sputtering on a coating surface of a substrate is proposed (for example, see JP-A-2004-174921). In this technique, a sputtering apparatus having a vacuum chamber is used. Inside the vacuum chamber, a substrate and a sputtering target made of a film deposition material are disposed so as to be opposed to each other with a predetermined distance therebetween. In such a condition, high energy particles such as ions of inert gas are brought into collision with the sputtering target to allow sputtering particles such as atoms and ions constituting the sputtering target are emitted or discharged (flied out) from the sputtering target. Then, by adhering and deposing the sputtering particles on the coating surface of the substrate, a coating film of a metallic film of the same material as that of the sputtering target is formed, and thus the decorated product is obtained.

In the decorated product obtained by such a technique using sputtering, a coating film made of a metallic film is formed on the substrate to have a sufficiently smaller film thickness compared to the case where the coating film is formed by a plating film. Therefore, a corner part or an edge of the substrate has a sharply angular shape like a corner part or an edge of metallic product, and hence metallic surface is expressed more real compared to the decorated products formed with a metallic coating film, a metallic ink layer, a plating film and the like on the substrate.

By the way, in many products having metallic decoration obtained in various techniques as described above, it is often desired that thickness of the coating film formed on the coating surface of the substrate gradually increases or gradually decreases, for example, from the side of a predetermined one end to the side of the other end opposite to the one end in the width direction, for example, in order to improve the appearance by gradation effect, or to obtain metallic shine with varied intensity.

For example, of interior parts of automobile in decorated products used for parts that transmit various illumination light in a vehicle interior, it is sometimes advantageous that the coating film is formed on the coating surface to have such a film thickness that gradually increases or gradually decrease from a predetermined one end side to the other end side, in order to impressively produce light and dark of transmitted beam by gradation effect realized by the difference in film thickness of the coating film. Furthermore, in a decorated product that constitutes a part of an instrument panel of automobile, when the region around the front glass which receives direct sunlight has strong metallic shine, there is a fear that safety is impaired because the light reflected by the region around the front glass hinders the vision of the driver. For this reason, it is desired that film thickness of the coating film formed in such a part of the coating surface situated near the front glass is made small, while film thickness of the coating film formed in the remaining part of the coating surface is made large so that sufficient metallic shine is obtained.

However, it was very difficult to obtain such a decorated product in which thickness of the coating film formed on the coating surface of the substrate gradually increases or decreases from a predetermined one end side to the other end side by a technique using sputtering which is capable of expressing metallic surface more real. This is because in a conventional sputtering apparatus, it was very difficult to control the amount of sputtering particles emitted from the sputtering target and deposited on the coating surface of the substrate, for individual regions in the coating surface.

According to a coating technique or a printing technique, a coating film having gradually increasing or gradually decreasing thickness may be formed on the coating surface of the substrate relatively easily. However, in a decorated product obtained in this manner, a quality essential for a metallically decorated product is not sufficiently ensured because the corner part and the edge have poor sharpness as described above.

SUMMARY OF THE INVENTION

The present invention has been made in the light of the situation described above. It is an object of the present invention to provide a sputtering apparatus capable of forming a coating film made of a metallic film on the coating surface of the substrate by sputtering to have such a film thickness that gradually increases or gradually decreases from its one end side to the other end side, and hence advantageously obtaining a decorated product with metallic gradation having more real metallic appearance. It is another object of the present invention to provide a method for forming a coating film made of a metallic film on the coating surface of the substrate having such a film thickness that gradually increases or gradually decreases from its one end side to the other end side, by sputtering. It is still another object of the present invention to provide a decorated product with metallic gradation providing more real metallic appearance in which a coating film is formed on a coating surface of a substrate to have such a film thickness that gradually increases or gradually decreases from its one end side to the other end side. Hereinafter, the one end side and the other end side are also referred to as a first end portion and a second end portion, respectively.

To solve the aforementioned objects, or the problems understood from description throughout the present specification and drawings, the present invention may be preferably embodied according to various aspects which will be described below, and each aspect described below may be employed in any combination. It is to be understood that the aspects and technical features of the present invention are not limited to those described below, and can be recognized based on the inventive concept disclosed in description throughout the specification and drawings.

<1> A sputtering apparatus comprising: at least one substrate having a coating surface on which a coating film is to be formed; a sputtering target having an emission surface from which sputtering particles are emitted by sputtering; and a vacuum chamber having the at least one substrate and the sputtering target therein, the sputtering particles emitted from the sputtering target being deposited on the coating surface of the at least one substrate to form the coating film, the apparatus further comprising: (a) at least one supporting means disposed in the vacuum chamber and supporting the at least one substrate such that the coating surface thereof is opposed to the emission surface of the sputtering target at an angle; and (b) at least one shielding member for preventing part of the sputtering particles emitted from the emission surface from reaching the coating surface, the at least one shielding member being disposed in the vacuum chamber so as to correspond to the at least one substrate in a state in which the at least one shielding member is positioned in a space between the coating surface of the at least one substrate and the emission surface of the sputtering target, wherein the coating surface includes a first end portion and a second end portion which are located oppositely on the at least one substrate, the first end portion positioned on a side in which the at least one shielding member is disposed and the second end portion positioned on a side opposite to the side in which the at least one shielding member is disposed, and an amount of the sputtering particles to be reached the coating surface of the at least one substrate gradually increases from the first end portion toward the second end portion of the coating surface.

<2> The sputtering apparatus according to the above aspect <1>, further comprising a first rotation body, in the vacuum chamber, which is rotatable around a first rotation axis extending in one of a vertical direction and a horizontal direction, wherein the at least one supporting means comprises a plurality of supporting means, the plurality of supporting means being disposed on the first rotation body so as to be spaced apart from each other with a predetermined distance therebetween in a circumferential direction, and wherein the at least one substrate supported by each of the plurality of the supporting means is rotatable around the first rotation axis together with the plurality of the supporting means.

<3> The sputtering apparatus according to the above aspect <1>, wherein the at least one supporting means is rotatable around a second rotation axis extending in one of a vertical direction and a horizontal direction at a position different from a position where the at least one substrate supported by the at least one supporting means is disposed, the at least one substrate being rotatable around the second rotation axis together with the at least one supporting means, and wherein a displace amount of the coating surface of the at least one substrate in a circumferential direction gradually increases from the first end portion toward the second end portion of the coating surface.

<4> The sputtering apparatus according to the above aspect <3>, wherein the second rotation axis is disposed at a different position from a position where the at least one shielding member is disposed, and wherein the at least one shielding member is rotatable around the second rotation axis together with the at least one supporting means.

<5> The sputtering apparatus according to the above aspect <3> or <4>, wherein the at least one supporting means comprises a plurality of supporting means and the at least one substrate comprises a plurality of substrates, the plurality of supporting means being arranged so as to space apart from each other with a predetermined distance therebetween in a circumferential direction around the second rotation axis while the plurality of substrates are supported by the plurality of supporting means, and wherein the at least one shielding member is disposed between the plurality of substrates adjacent to each other in the circumferential direction.

<6> The sputtering apparatus according to any one of the above aspects <3> to <5>, wherein the at least one supporting means comprises a plurality of supporting means, the plurality of supporting means being arranged so as to space apart from each other with a predetermined distance therebetween in a circumferential direction around the second rotation axis, and wherein the at least one substrate comprises a plurality of substrates, the plurality of substrates being supported by the plurality of supporting means such that the coating surfaces thereof are extended radially from the second rotation axis.

<7> The sputtering apparatus according to any one of the above aspects <3> to <6>, wherein the at least one shielding member comprises a plurality of shielding members, each of the plurality of shielding members including an opposing surface which faces the emission surface of the sputtering target at an angle, and wherein the at least one substrates comprises a plurality of substrate, each of the plurality of shielding members being disposed between the plurality of substrates adjacent to each other in a circumferential direction in a state in which the opposing surface extends radially from the second rotation axis.

<8> The sputtering apparatus according to any one of the above aspects <3> to <7>, wherein the at least one shielding member includes an opposing surface which faces the emission surface of the sputtering target at an angle, and wherein the at least one substrate supported by the at least one supporting means constitutes the at least one shielding member, and the coating surface of the at least one substrate constitutes the opposing surface of the at least one shielding member.

<9> The sputtering apparatus according to any one of the above aspects <3> to <8>, further comprising a second rotation body in the vacuum chamber which is rotatable around a third rotation axis extending in one of a vertical direction and a horizontal direction, wherein the at least one supporting means comprises a plurality of supporting means, each of the plurality of supporting means being disposed on the second rotation body so as to rotate around each of the plurality of second rotation axes disposed on the second rotation body.

<10> A decorated article produced by forming a coating film on a coating surface of at least one substrate, the coating film being produced by depositing sputtering particles emitted from a sputtering target by sputtering, wherein the sputtering apparatus according to any one of the above aspects <1> to <9> is employed to form the coating film having a thickness which gradually increases from the first end portion toward the second end portion of the coating surface.

<11> A method for forming a coating film by sputtering, the method comprises the steps of: (a) disposing at least one substrate in a vacuum chamber such that a coating surface of the at least one substrate is opposed at an angle to an emission surface of a sputtering target from which sputtering particles are emitted; (b) disposing at least one shielding member in a space between the coating surface of the at least one substrate and the emission surface of the sputtering target, the at least one shielding member preventing part of the sputtering particles emitted from the emission surface from reaching the coating surface; and (c) emitting the sputtering particles from the emission surface of the sputtering target by sputtering and preventing part of the sputtering particles from reaching the coating surface by the shielding member, wherein the coating surface includes a first end portion and a second end portion which are located oppositely on the at least one substrate, the first end portion being positioned on a side in which the at least one shielding member is disposed and the second end portion being positioned on a side opposite to the side in which the at least one shielding member is disposed, whereby the coating film is formed by the sputtering particles deposited on the coating surface and an amount of the sputtering particles to be reached the coating surface of the at least one substrate gradually increases from the first end portion toward the second end portion of the coating surface.

<12> A sputtering apparatus comprising: at least one substrate having a coating surface on which a coating film is to be formed; a sputtering target having an emission surface from which sputtering particles are emitted by sputtering; and a vacuum chamber having the at least one substrate and the sputtering target therein, the sputtering particles emitted from the sputtering target being deposited on the coating surface of the at least one substrate to form the coating film, the sputtering apparatus further comprising: (a) at least one supporting means disposed in the vacuum chamber and supporting the at least one substrate such that the coating surface thereof is opposed at an angle or parallel to the emission surface of the sputtering target; (b) at least one shielding member for preventing part of the sputtering particles emitted from the emission surface from reaching the coating surface, the at least one shielding member being disposed in the vacuum chamber so as to correspond to the at least one substrate in a state in which the at least one shielding member is positioned in a space between the coating surface of the at least one substrate and the emission surface of the sputtering target; and (c) a movement mechanism for moving the at least one shielding member to the space between the coating surface of the at least one substrate and the emission surface of the sputtering target, wherein the coating surface includes a first end portion and a second end portion which are located oppositely on the at least one substrate, the first end portion positioned on a side in which the at least one shielding member is disposed and the second end portion positioned on a side opposite to the side in which the at least one shielding member is disposed, whereby an amount of the sputtering particles to be reached the coating surface of the at least one substrate gradually increases from the first end portion toward the second end portion of the coating surface.

<13> The sputtering apparatus according to the above aspect <12>, wherein the at least one substrate is movable with the at least one shielding member by the movement mechanism.

<14> A sputtering apparatus comprising: a plurality of substrates each having a coating surface on which a coating film is to be formed; a sputtering target having an emission surface from which sputtering particles are emitted by sputtering; and a vacuum chamber having the plurality of substrates and the sputtering target therein, the sputtering particles emitted from the sputtering target being deposited on each of the coating surface of the plurality of substrate to form the coating film, the sputtering apparatus further comprising: (a) at least one supporting means, in the vacuum chamber, which is rotatable around a rotation axis extending in one of a vertical direction and a horizontal direction and which supports the plurality of substrates such that the coating surface thereof extends radially from the rotation axis, each of the coating surface of the plurality of substrates being opposed at an angle or parallel to the emission surface of the sputtering target in turn by rotating the plurality of substrates along with the rotation of the supporting means around the rotation axis 360°; (b) a plurality of shielding members for preventing part of the sputtering particles emitted from the emission surface from reaching the coating surfaces of the plurality of the substrates, the plurality of shielding member being disposed in the vacuum chamber so as to correspond to the plurality of substrates in a state in which the plurality of shielding member is positioned in a space between the plurality of substrates adjacent to each other in the circumferential direction; and (c) a movement mechanism for moving the at least one shielding member to the space between the coating surface of the at least one substrate and the emission surface of the sputtering target, wherein the coating surface includes a first end portion and a second end portion which are located oppositely on the at least one substrate, the first end portion positioned on a side in which the at least one shielding member is disposed and the second end portion positioned on a side opposite to the side in which the at least one shielding member is disposed, whereby an amount of the sputtering particles to be reached the coating surfaces of the plurality of substrates gradually increases from the first end portion toward the second end portion of the coating surface.

<15> The sputtering apparatus according to the above aspect <14>, wherein the plurality of substrates constitutes the plurality of shielding members.

<16> The sputtering apparatus according to the above aspect <14> or <15>, wherein the at least one supporting means includes the rotation axis, a plurality of arm portions provided on the rotation axis so as to extend radially therefrom, and a supporting part provided at a tip end of each of the plurality of arm portions for supporting the plurality of substrates and the plurality of shielding members in a detachable manner.

<17> The sputtering apparatus according to any one of the above aspects <14> to <16>, further comprising, in the vacuum chamber, a rotation body rotatable around a rotation axis which is separate from the rotation axis of the at least one supporting means and which extends in one of a vertical direction and horizontal direction, and a second rotary mechanism that rotates the rotation body around its rotation axis, wherein the at least one supporting mean comprises a plurality of supporting means, the plurality of supporting means being disposed on the rotation body so as to be spaced apart from each other with a predetermined distance therebetween in a circumferential direction in a rotatable manner around a respective rotation axis.

In the sputtering apparatus according to the present invention, a shielding member that prevents part of sputtering particles emitted from the emission surface from reaching the coating surface enters and is disposed in the space between the coating surface of the substrate supported by the supporting means and the emission surface of the sputtering target. As a result, the amount of sputtering particles that reaches the coating surface gradually increases from one end portion of the coating surface situated on the side where the shielding member is disposed, to the other end portion of the coating surface situated on the side opposite to the side where the shielding member is disposed.

Therefore, in the sputtering apparatus according to the present invention, it is possible to control the amount of sputtering particles that are emitted from the emission surface of the sputtering target and deposited on the coating surface of the substrate, for the individual region in the coating surface, such that it gradually increases from the one end portion to the other end portion of the coating surface.

Further, according to the apparatus of the present invention, a coating film forming technique using sputtering is employed. Therefore, the entire thickness of the coating film formed on the coating surface can be made sufficiently thin. As a result, the shapes of corner part and edge of the area where the coating film is formed can be made into a sharply angular form, which is peculiar to metal.

Therefore, by using the sputtering apparatus according to the present invention, it is possible to form a coating film made of metallic film to have a thickness that gradually increases from the one end portion to the other end portion on the coating surface of the substrate. As a result, it is possible to advantageously obtain a decorated product having metallic gradation which is more similar to a real metal product. That is, in a finally obtained decorated product, not only metallic surface is expressed more real, but also improvement in appearance and gradually changing metallic shine are effectively realized by the gradation effect.

In the sputtering apparatus according to the present invention, the coating surface of the substrate is located so as to be opposed at angle with the emission surface of the sputtering target. Therefore, for example, by appropriately changing the angle of inclination with respect to the emission surface of the coating surface, it is possible to change the film thickness of the coating film formed on the coating surface in various ways. As a result, in a finally obtained decorated product, more varied gradation effects can be achieved.

In the decorated product according to the present invention, by the coating film made of metallic film formed to have a film thickness gradually increasing on the coating surface of the substrate, the metallic surface in appearance is expressed further real, and improvement in appearance and gradually changing metallic shine by gradation effect can be advantageously realized.

According to the method for forming the coating film by sputtering of the present invention, substantially the same operation and effect as those provided by the above sputtering apparatus can be enjoyed very effectively.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which.

DETAILED DESCRIPTION OF THE INVENTION

To further clarify the present invention, there will be described a preferred embodiment of the invention by referring to drawings.

Figure 1:
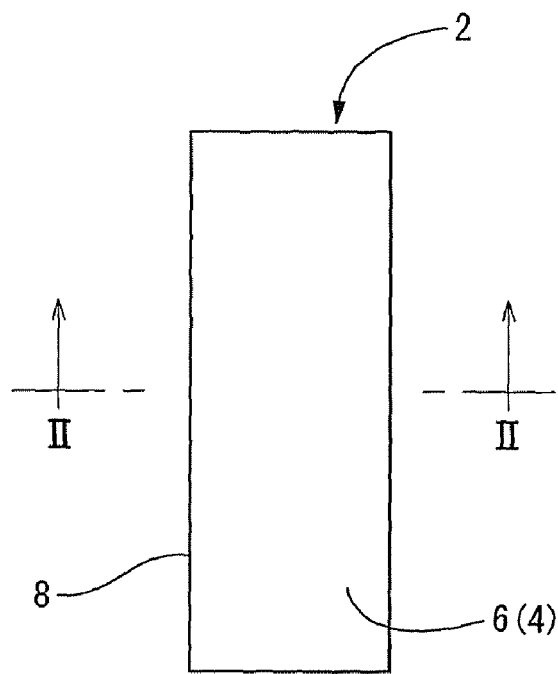
FIG. 1 is a front view showing one example of a decorated product formed by using a sputtering apparatus according to the present invention.
Figure 2:
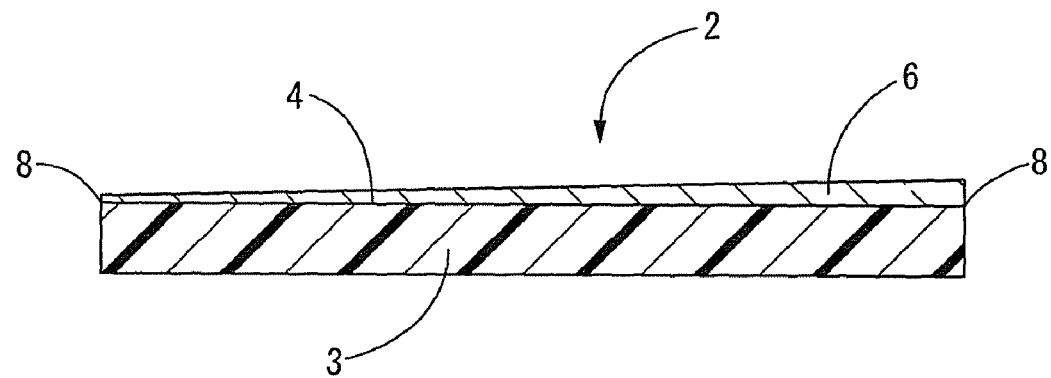
FIG. 2 is an enlarged view of a cross section taken along the line II-II of FIG. 1.

Referring first to FIGS. 1 and 2, there is shown a front view and a longitudinal vertical view, respectively, of an automobile interior part which is one example of a decorated product, produced by using a sputtering apparatus having a structure according to the present invention. As is apparent from these drawings, an automobile interior part 2 has a substrate 3 formed of a longitudinally rectangular flat plate having a predetermined thickness.

More specifically, the substrate 3 is made of a resin molded member formed by using a resin material such as polypropylene or ABS resin. In the substrate 3, one face in the thickness direction is provided as a design surface 4 which is a coating surface. On the design surface 4, a coating film 6 formed of a metallic film is formed over the entire face by using a sputtering apparatus (10) which will be described later. As a result, decoration that provides metallic surface in appearance is made on the design surface 4 of the substrate 3, and thus the automobile interior part 2 is formed.

Here, thickness of the coating film 6 formed on such design surface 4 is made sufficiently thin as a whole, and gradually increases from one end side to the other end side in the width direction of the substrate 3 (automobile interior part 2). As a result, the automobile interior part 2 has an edge 8 of the design surface 4 that is formed into a sharply angular shape, and is provided with an excellent metallic gradation. It is to be understood that in FIG. 2, the coating film 6 is shown to have an extremely larger thickness than its actual thickness for facilitating understanding of the form of the coating film 6 having a gradually increasing thickness.

Figure 3:
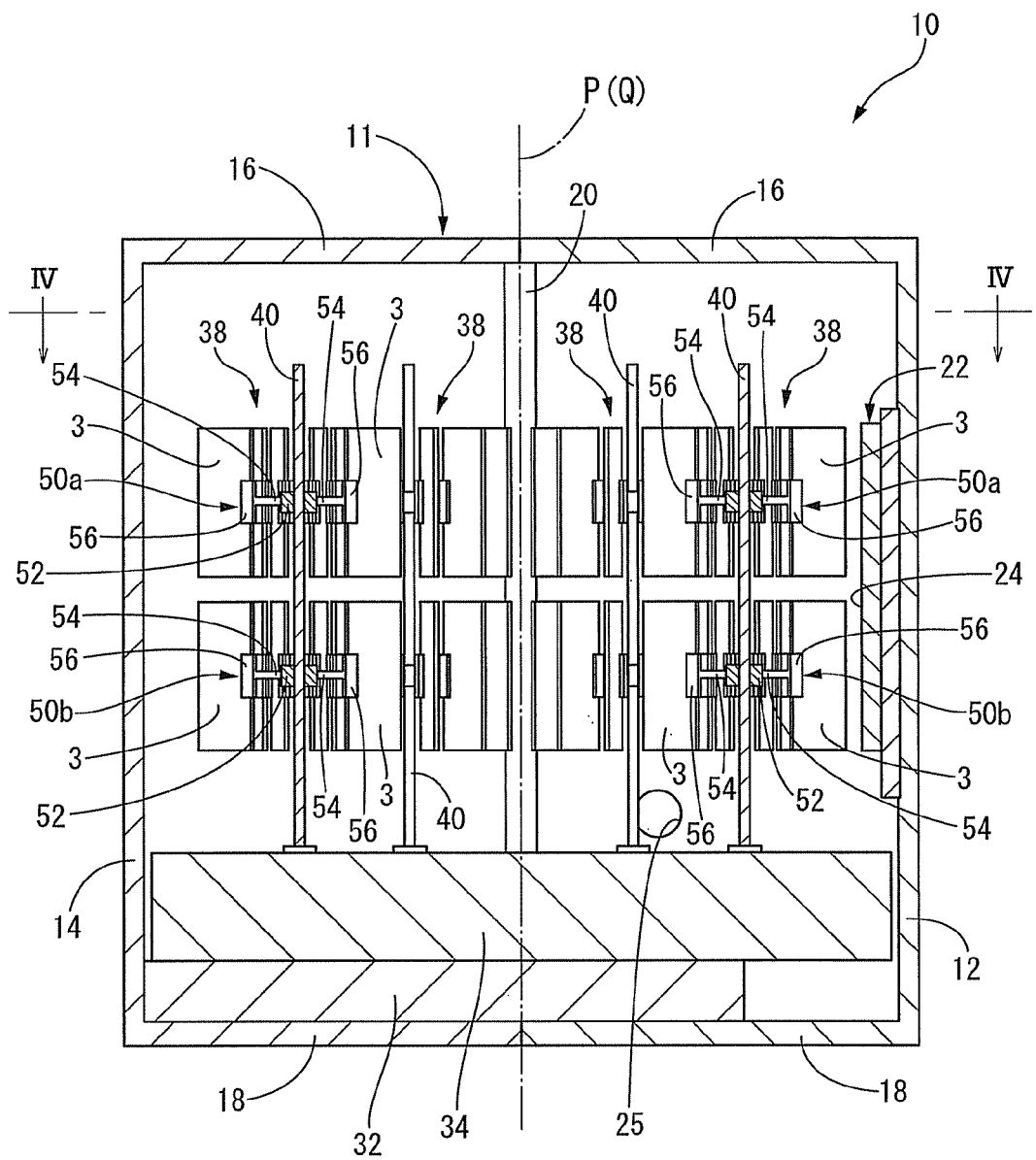
FIG. 3 is an axial cross sectional view showing one embodiment of a sputtering apparatus having a structure according to the present invention, corresponding to a cross section taken along the line III-III of FIG. 4.
Figure 4:
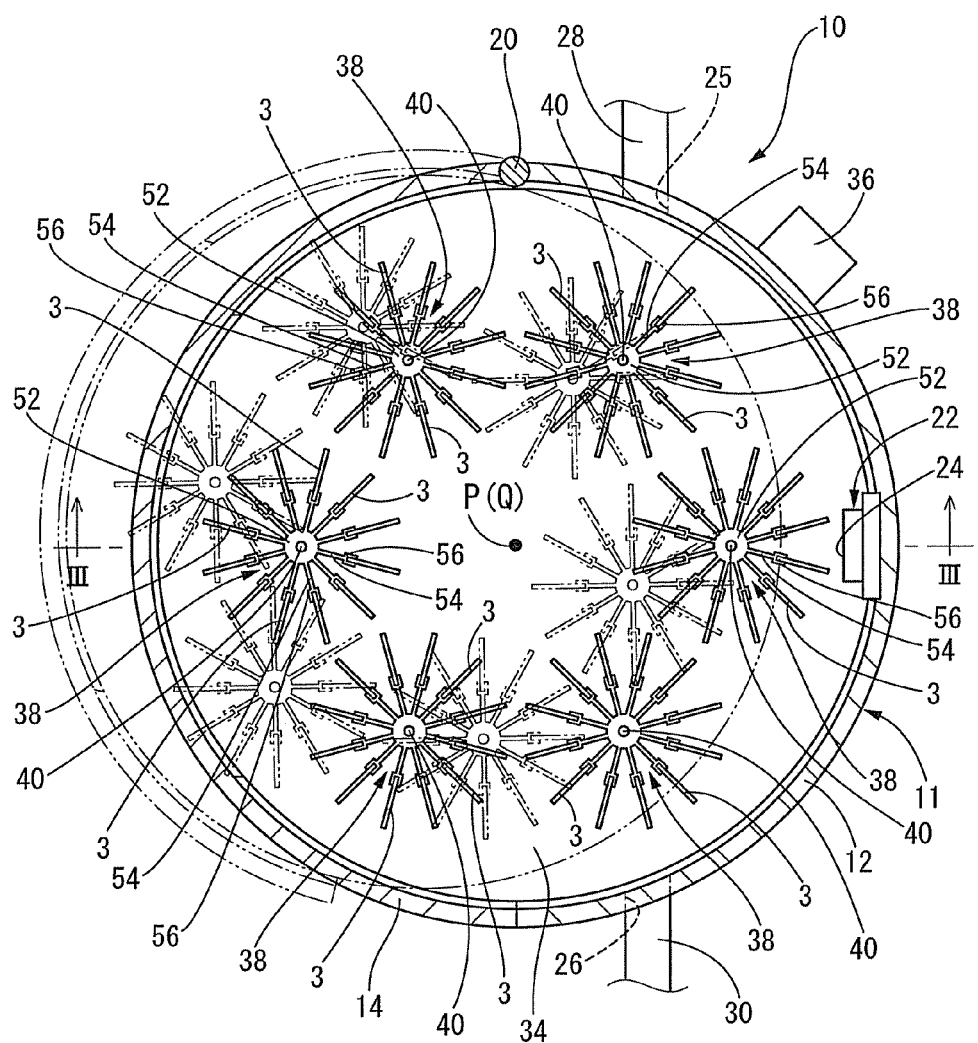
FIG. 4 is a cross sectional view taken along the line IV-IV of FIG. 3.

Next, FIGS. 3 and 4 schematically show a vertical cross sectional view and a traverse cross sectional view, respectively, of an embodiment of a sputtering apparatus having a structure of the present invention used for forming the coating film 6 having gradually increasing thickness on the design surface 4 of the substrate 3, in the production of the automobile interior part 2 having the structure as described above.

As is apparent from these FIGS. 3 and 4, the sputtering apparatus 10 has a vacuum chamber 11. The vacuum chamber 11 has a generally cylindrical box-like configuration having bottoms. Specifically, the vacuum chamber 10 includes a stationary cylindrical wall portion 12 and a movable cylindrical wall portion 14 each having a half-split cylindrical shape extending in the vertical direction. At upper ends and lower ends of the stationary cylindrical wall portion 12 and the movable cylindrical wall portion 14, upper bottom wall portions 16, 16 and lower bottom wall portions 18, 18, respectively having a semicircular disc shape extending in the horizontal direction are integrally formed. The stationary cylindrical wall portion 12 and the movable cylindrical wall portion 14 are connected with each other via a hinge 20. As shown by the two-dot chain line and solid line in FIG. 4, the vacuum chamber 11 is opened or hermetically sealed as the movable cylindrical wall portion 14 is rotated around the hinge 20 as its rotation center.

The vacuum chamber 10 is provided with a sputtering target 22 fixedly attached at a center portion in a circumferential direction of an inner circumferential surface of the stationary cylindrical wall 12. The sputtering target 22 has a longitudinal rectangular flat plate shape, and one face thereof in the thickness direction is made as an emission surface 24 that emits sputtering particles upon irradiation of high-energy particles in the sputtering operation, which will be described later. The sputtering target 22 is arranged in such a manner that the emission surface 24 is directed to a center axis P of the vacuum chamber 11 and extends in the vertical direction.

Here, the sputtering target 22 is comprised of a material of the coating film 6 formed of a metal thin film which is to be formed on the design surface 4 of the substrate 3 (automobile interior part 2). Specifically, for example, a metallic material such as aluminum, copper, nickel, chromium is used alone or an alloy material made of two or more kinds of metallic materials selected therefrom or various stainless steels and the like is used to form the sputtering target 22. Although not shown in the drawing, the sputtering target 22 is connected with a power supply unit for applying a predetermined voltage thereto.

At one end portion of the stationary cylindrical wall 12 in the circumferential direction, a gas emission hole 25 is provided, and at the other end portion thereof in the circumferential direction, a gas introduction hole 26 is provided. The gas emission hole 25 is connected with one end of a gas emission pipe 28 which is connected with a vacuum pump (not shown) at the other end. The gas introduction hole 26 is connected with one end of a gas introduction pipe 30 which is connected with a gas supply device (not shown) for supplying reaction gas such as inert gas at the other end.

At a lower end of the movable cylindrical wall portion 14, a base 32 is fixedly provided. On the base 32, a rotation stage 34 is provided. The rotation stage 34 has a circular shape, and is rotated around a rotation axis: Q (the same axis with the center axis: P of the vacuum chamber 11) of the rotation stage 34 extending in the vertical direction (up-and-down direction) by cooperative operation of a known gear mechanism serving as a second rotary mechanism provided inside the base 32 and an electric motor (not shown). The electric motor (not shown) that rotates the rotation stage 34 is controlled by a controller 36 disposed on the outer circumferential face of the stationary cylindrical wall portion 12 in such a manner that it is intermittently rotationally driven by a predetermined rotation angle in a single direction. In this manner, the rotation stage 34 is rotated intermittently by 60° at a predetermined time interval.

Figure 5:
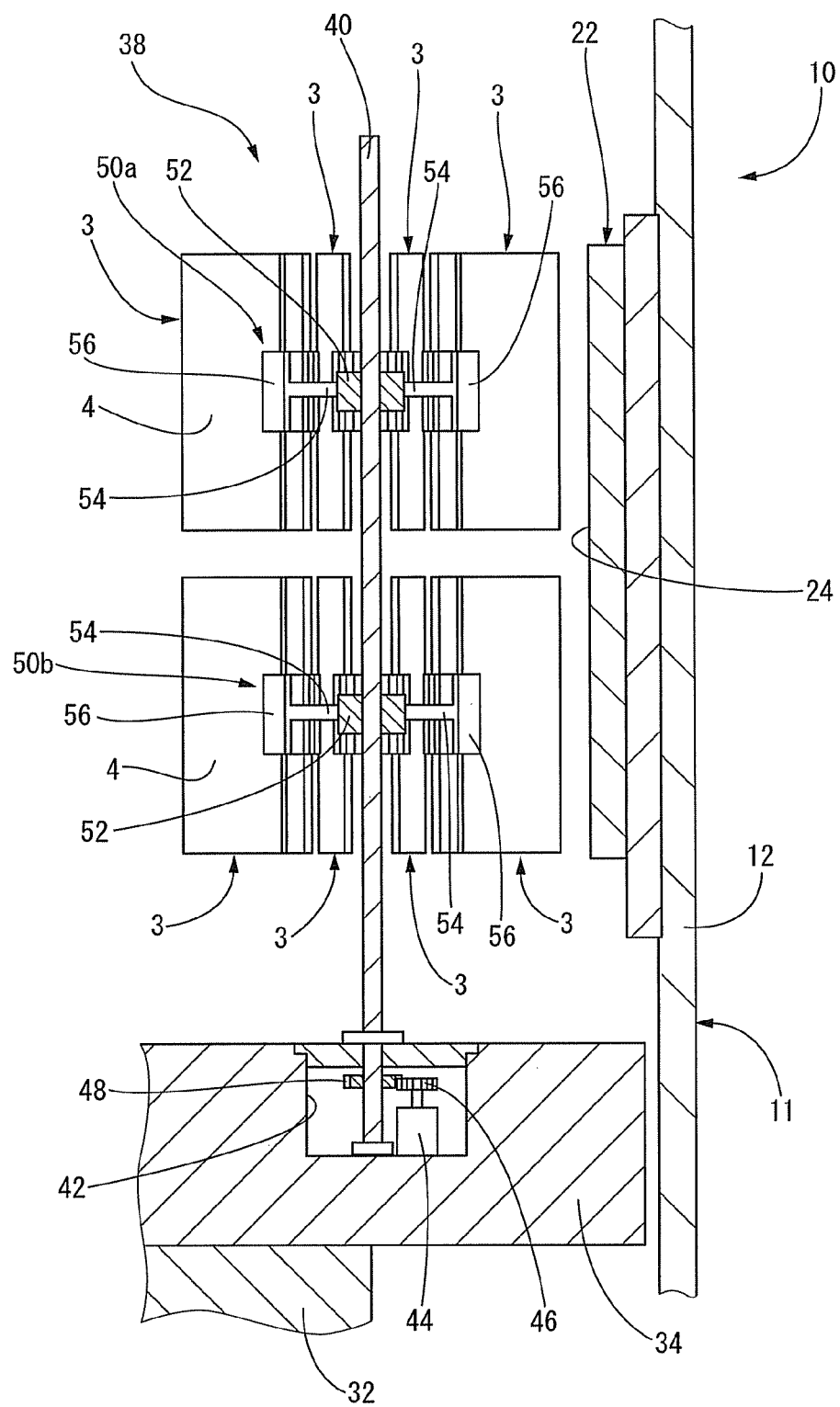
FIG. 5 is a partly enlarged view of FIG. 3.

On the outer circumferential part of the rotation stage 34, six supporting devices 38 serving as supporting means are disposed with a predetermined distance therebetween in the circumferential direction of the rotation stage 34. Each of these supporting devices 38 has a rod-like rotation axis 40 formed of a longitudinal round bar as shown in FIGS. 3 to 5. Each of the rod-like rotation axes 40 of the six supporting devices 38 is supported in a rotatable manner with respect to the rotation stage 34. The rod-like rotation axes 40 are disposed in a substantially middle part between the rotation axis: Q and the outer circumferential edge of the rotation stage 34 such that they are spaced apart from each other in the circumferential direction at a constant interval and are extended in the vertical direction.

In the present embodiment, the first rotation body described in the aforementioned aspect <2> of the present invention, the second rotation body described in the aforementioned aspect <9> of the present invention, and the rotation body described in the aforementioned aspect <17> of the present invention are embodied by the rotation stage 34. Further, the first rotation axis described in the aforementioned aspect <2> of the present invention, the third rotation axis described in the aforementioned aspect <9> of the present invention, and the rotation axis which is separate from the rotation axis of the at least one supporting means described in the aforementioned aspect <17> of the present invention are embodied by the rotation axis: Q of the rotation stage 34. Further, the second rotation axes described in the aforementioned aspects <3> to <7> and <9> of the present invention, and the rotation axes of the supporting means described in the aforementioned aspects <14>, <16> and <17> of the present invention are embodied by the rod-like rotation axis 40.

As shown in FIG. 5, at each of six positions in the rotation stage 34 where each of the respective rod-like rotation axes 40 of the supporting devices 38 is rotatably disposed, a recess 42 that opens upward is provided. At a bottom part of the recess 42, an electric motor 44 is provided. A driving gear 46 attached to a driving axis of the electric motor 44 is engaged with a driven gear 48 fixed on the lower portion of the rod-like rotation axis 40. In this way, the rod-like rotation axis 40 is allowed to rotate along with driving of the electric motor 44.

Here, either one of the six supporting devices 38 is allowed to be located between the rotation axis Q of the rotation stage 34 (center axis P of the vacuum chamber 11) and the emission surface 24 of the sputtering target 22, in a state in which the rod-like rotation axis 40 is positioned on the straight line connecting them, every time the rotation stage 34 is rotated by 60°. In other words, one of the supporting devices 38 is located at an operation position where a formation operation of the coating film 6 on the design surface 4 of the substrate 3 by sputtering which, will be described later, is executed. In the condition that the one supporting device 38 is situated at such an operation position, rotation driving of the electric motor 44 is controlled by the controller 36 in such a manner that the electric motor 44 is rotationally driven 360° and the rod-like rotation axis 40 is rotated 360° at a sufficiently low speed while the rotation of the rotation stage 34 is suspended.

In the middle part in the height direction (longitudinal direction) of the rod-like rotation axis 40 of each of the supporting device 38, two supporting members 50a and 50b are secured with a predetermined distance therebetween in the vertical direction. Each of the upper and lower supporting members 50a and 50b has a cylindrical stationary portion 52 fitted and secured on the rod-like rotation axis 40, twelve arm portions 54 extending radially outwardly and horizontally from the outer circumferential face of the stationary portion 52 with the same lengths, and a clamp portion 56 serving as a supporting part provided integrally at a tip of each of the twelve arm portions 54. The clamp portion 56 has a branched shape capable of holding a part of the outer circumferential part of the substrate 3 extending in the longitudinal direction, from both sides. The substrate 3 can be held in a detachable manner by clamping of a clamp bolt (not shown).

As a result, twelve substrates 3 are detachably supported at each of the upper supporting member 50*a* and the lower supporting member 50*b* of each of six supporting devices 38 while being extended out in the extending direction of each arm portion 54.

Figure 6:
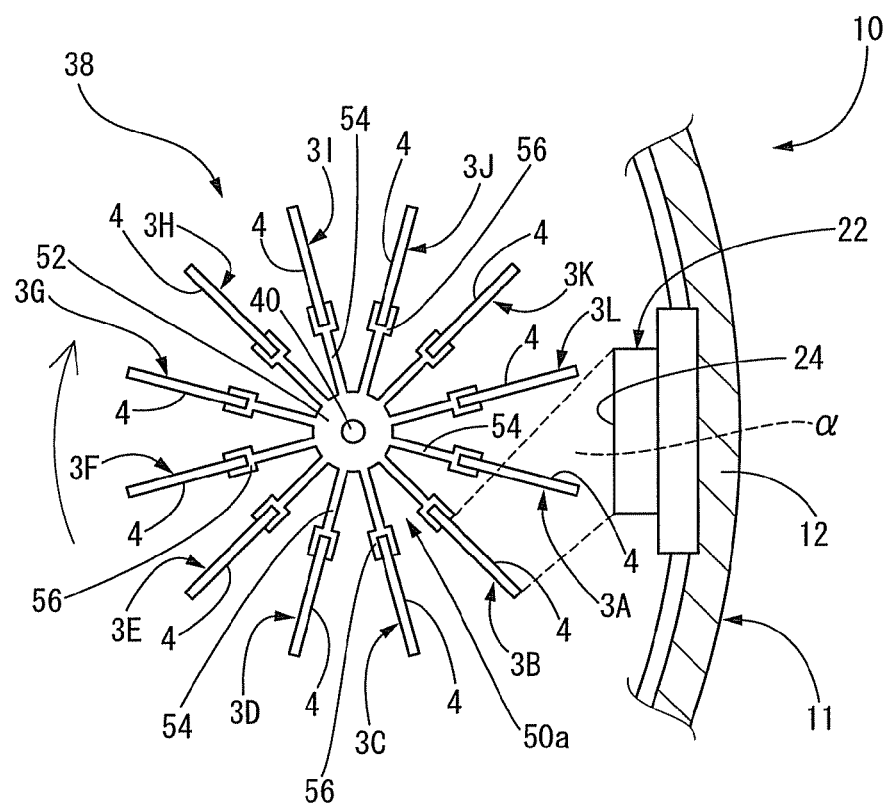
FIG. 6 is a partly enlarged view of FIG. 4.

As shown in FIG. 6, all of the substrates 3A to 3L respectively supported by the upper and the lower supporting members 50*a* and 50*b* of each of the supporting devices 38 are disposed in the condition that the design surface 4 is extended out radially from the rod-like rotation axis 40. Additionally, in association with rotation of the rod-like rotation axis 40 of each of the supporting devices 38, all of the substrates 3A to 3L are allowed to rotate integrally around the rod-like rotation axis 40.

As is apparent from FIG. 6, when one of the six supporting devices 38 is located at the operation position (position between the rotation axis Q and the sputtering target 22 where forming operation of the coating film 6 is executable), either one of the substrates 3A to 3L (substrate 3B in FIG. 6) respectively supported by the upper and the lower supporting members 50*a* and 50*b* of the supporting device 38 is located such that the design surface 4 thereof is opposed to the emission surface 24 of the sputtering target 22 at an angle. In other words, either one of the substrates 3A to 3L is arranged such that the extended face of the design surface 4 intersects with the extended face of the emission surface 24 of the sputtering target 22 at an angle of larger than 0° and smaller than 90°.

In such a condition, the rod-like rotation axis 40 of the supporting device 38 located at the operation position is rotated, for example, in the direction shown by the arrow in FIG. 6 (clockwise direction), whereby all of twelve substrates 3 respectively supported by the upper and the lower supporting members 50*a* and 50*b* are allowed to sequentially position the respective design surfaces 4 so as to be opposed to the emission surface 24 of the sputtering target 22 at an angle in the order of alignment sequence in the circumferential direction. On the other hand, in association with rotation of the rotation stage 34, the remaining five supporting devices 38 are located sequentially and alternately one by one at the operation position, and as the rod-like rotation axis 40 of the supporting device 38 located at the operation position is rotated, all of the substrates 3 supported by the remaining five supporting devices 38 are allowed to sequentially oppose the respective design surfaces 4 to the emission surface 24 of the sputtering target 22 at angle.

Here, in particular, of the plurality of substrates 3A to 3L respectively supported by the upper and the lower supporting member 50*a* and 50*b* of the supporting device 38 located at the operation position, a part of a substrate 3 other than the one opposed to the emission surface 24 enters the area between the design surface 4 of the substrate 3 whose design surface 4 is located to be opposed to the emission surface 24 of the sputtering target 22 at an angle and the emission surface 24 of the sputtering target 22.

Described more specifically, taking substrate 3B in FIG. 6 as an example in which the design surface 4 thereof is located to be opposed to the emission surface 24 of the sputtering target 22 at an angle, the substrate 3A which is adjacent to the substrate 3B on the backward side (opposite side of the direction of the arrow in FIG. 6) in the rotation direction of all of the substrates 3 along with rotation of the rod-like rotation axis 40 (clockwise direction shown by the arrow in FIG. 6) enters inside a space α between the design surface 4 of the substrate 3B and the emission surface 24 of the sputtering target 22, namely inside a space α surrounded by a plurality of imaginary faces extending to connect outer circumferential edges corresponding to the design surface 4 and the emission surface 24, at a tip end part thereof which is positioned opposite to the side where the substrates are supported at the supporting members 50*a* and 50*b*, from one side in the width direction of the substrate 3B situated on the side of the clamp portion 56 of the supporting member 50. As a result, in the space α, the tip end of the substrate 3A partly shields the space between the design surface 4 of the substrate 3B and the emission surface 24 of the sputtering target 22.

Every time all of the substrates 3 supported by the supporting device 38 located at the operation position is integrally rotated with the rod-like rotation axis 40 and the substrate 3 having the design surface 4 which is opposed to the emission surface 24 of the sputtering target 22 at an angle is changed in turn, the substrate 3 entering inside the space α is also changed in turn to the one which is positioned adjacent backward in the rotation direction of the substrate 3 having the design surface 4 which is opposed to the emission surface 24.

In the formation of the coating film 6 by sputtering, which will be described later, on the design surface 4 of the substrate 3 which is opposed to the emission surface 24 of the sputtering target 22 at an angle, part of sputtering particles emitted and flying straight from the emission surface 24 of the sputtering target 22 is adhered at the tip end of the design surface 4 of the substrate 3 which is positioned backward in the rotation direction of the substrate 3 on which the coating film 6 is to be formed and which entered the space α between the design surface 4 and the emission surface 24. As a result, the part of the sputtering particles is prevented from reaching the design surface 4 of the substrate 3 on which the coating film 6 is to be formed. This applies not only to the substrate 3 supported by the upper supporting member 50*a* but also to the substrate 3 supported by the lower supporting member 50*b*.

As is apparent from this, in the present embodiment, a shielding member is constituted by the substrate 3 that is positioned backward in an integral rotation direction of the substrate 3 having the design surface 4 on which the coating film is to be formed with the rod-like rotation axis 40. The design surface 4 of the substrate 3 serving as the shielding member constitutes an opposing surface of the shielding member. Accordingly, the substrate 3 serving as a shielding member is supported by the supporting device 38 in the condition that the opposing surface constituted by the design surface 4 is located so as to extend radially from the rod-like rotation axis 40 of the supporting device 38 which is a supporting means. Of the plurality of substrates 3, the substrate 3 serving as a shielding member supported by the supporting device 38 is located between adjacent substrates 3 in the circumferential direction of the rod-like rotation axis 40 in correspondence with the plurality of substrates 3 supported by the supporting device 38. Further, the rod-like rotation axis 40 and the electric motor 44 that rotationally drives the axis 40 constitutes a displacing mechanism and a first rotary mechanism.

In the formation of the coating film 6 made of a metal thin film on the design surface 4 of the substrate 3 by the sputtering apparatus 10 of the present embodiment having the above structure, for example, the following procedure will be employed.

Initially, as indicated by two-dotted chain line in FIG. 4, the vacuum chamber 11 is opened, and then, each twelve substrates 3 are supported by the upper and the lower supporting members 50*a* and 50*b* of each of the supporting devices 38 by being clamped by the clamp portions 56. At this time, the design surfaces 4 of all of the substrates 3 are located so as to extend radially from the rod-like rotation axis 40 of the supporting device 38 and directed toward frontward of the rotation direction of the rod-like rotation axis 40. Further, on the face other than the design surface 4 of each substrate 3, predetermined masking is made, for example, with a known masking tape as needed.

Next, as is shown by solid lines in FIGS. 3 and 4, the vacuum chamber 11 is hermetically sealed. At this time, the rotation stage 34 is rotated as needed, and one of the six supporting devices 38 is located at the operation position.

Figure 7:
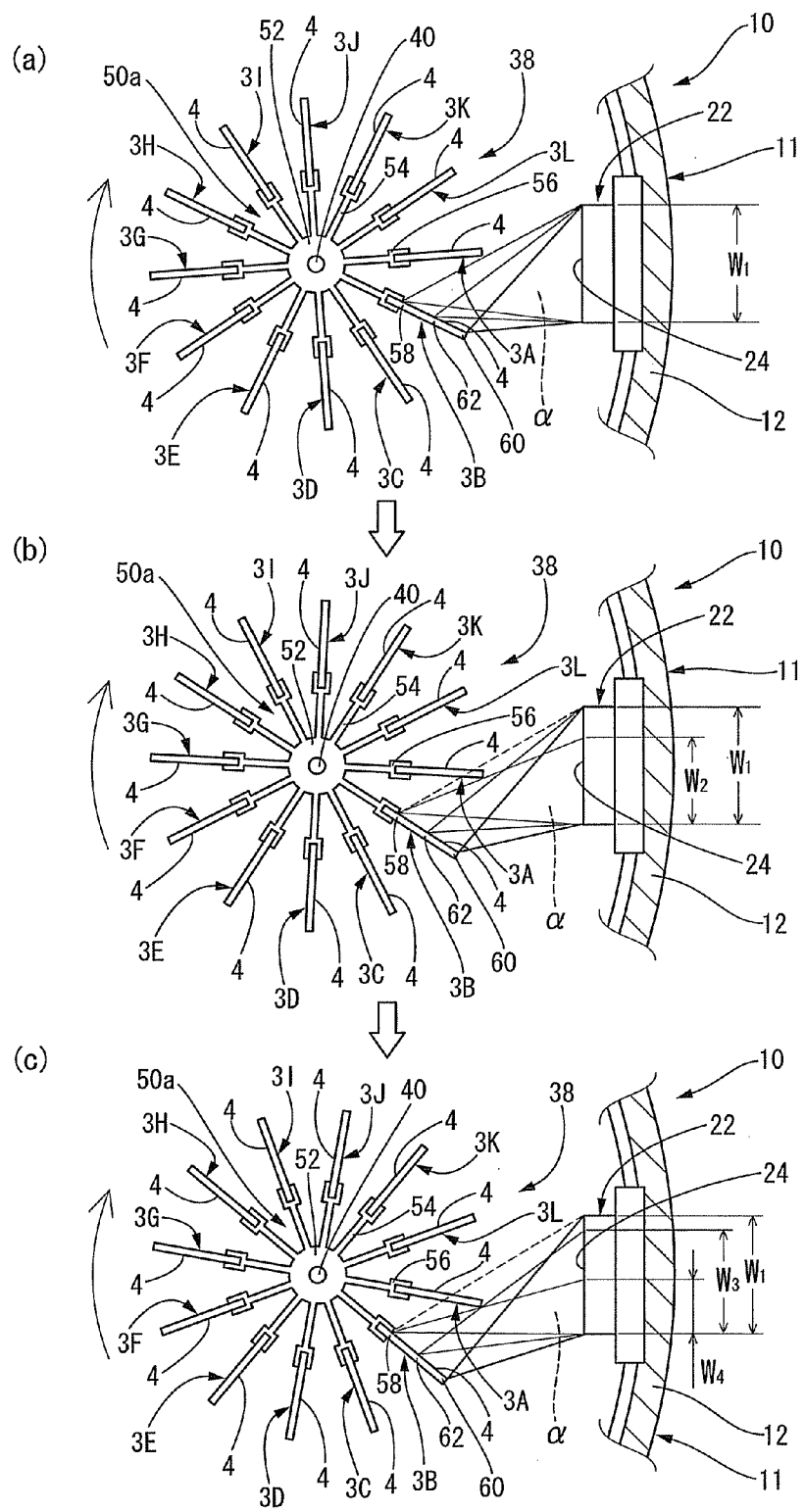
FIG. 7 is an explanatory view showing one example of a process for forming a coating film on a design surface of a substrate using the sputtering apparatus shown in FIGS. 3 and 4 according to the method of the present invention.

Thereafter, the rod-like rotation axis 40 of the supporting device 38 located at the operation position is rotated by a necessary amount as needed, and as shown in FIG. 7(a), any one of the substrates 3A to 3L supported by the upper and the lower supporting members 50a, 50b of the supporting device 38, on which the coating film 6 is to be formed on the design surface 4 first (here, substrate 3B), is located at such a position where the design surface 4 thereof is opposed to the emission surface 24 of the sputtering target 22 at an angle. At this time, first, all of the substrates 3 other than the substrate 3B on which the coating film 6 is to be formed on the design surface 4 thereof are arranged so as not to enter the space: α between the design surface 4 of the substrate 3B and the emission surface 24 of the sputtering target 22. As a result, the entire face of the design surface 4 of the substrate 3B is opposed to the emission surface 24 of the sputtering target 22 at an angle without being shielded by other members.

In the condition that each of the substrates 3 is located at the position opposed to the emission surface 24 at an angle as described above and rotation of the rod-like rotation axis 40 is suspended, a vacuum pump, which is not illustrated, is operated. Accordingly, the air inside the vacuum chamber 11 is discharged outside through the gas emission hole 25 and the gas emission pipe 28, and the inside of the vacuum chamber 11 is made into a vacuumed condition having a predetermined vacuum level. Thereafter, a gas supply device, which is not illustrated, is operated to introduce a reaction gas composed of inert gas such as argon gas to the inside of the vacuum chamber 11 through the gas introduction hole 26 and the gas introduction pipe 30.

After the vacuum chamber 11 is filled with the reaction gas, a power supply unit connected with the sputtering target 22 and each of the supporting devices 38 provided inside the vacuum chamber 11 is operated to apply a direct current voltage between the sputtering target 22 and each of the supporting devices 38. As a result, glow discharge occurs between the sputtering target 22 and each of the supporting devices 38, and plasma is generated inside the vacuum chamber 11, in particular, ahead of the emission surface 24 of the sputtering target 22. Then, ionized inert gas inside the vacuum chamber 11 comes into collision with the emission surface 24 of the sputtering target 22 to cause a sputtering phenomenon. In this manner, innumerable sputtering particles are emitted (knocked out) from the emission surface 24 of the sputtering target 22. The sputtering particles emitted from the emission surface 24 of the sputtering target 22 fly straight, and a large amount of the sputtering particles reach and deposit on the design surface 4 of the substrate 3B which is opposed to the emission surface 24 of the sputtering target 22 at an angle while being supported by the supporting device 38 located at the operation position among all of the substrates 3 supported by each of the supporting devices 38. Thus, the operation of forming the coating film 6 on the design surface 4 of the substrate 3B gradually proceeds. In FIGS. 7(a) to 7(c) and the following description, detailed description will be made only for the operation of forming the coating film 6 by sputtering on the design surface 4 of the substrate 3B supported by the upper supporting member 50a. However, it is to be understood that on the other substrates 3A to 3L respectively supported by the upper supporting member 50a and the lower supporting member 50b, the coating film 6 may be formed by the same operation as the substrate 3B.

In the present operation, rotational driving of the electric motor 44 that rotates the rod-like rotation axis 40 of the supporting device 38 located at the operation position is started concurrently with actuation of the power supply unit, namely with start of the sputtering operation, whereby the rod-like rotation axis 40 and all of the substrates 3 supported by the supporting devices 38 are integrally rotated at a sufficiently slow constant speed. At this time, as the rotation proceed, a tip end part of the substrate 3A serving as a shielding member positioned adjacently backward of the substrate 3B in the rotation direction gradually enters the space α between the design surface 4 of the substrate 3B which is opposed to the emission surface 24 of the sputtering target 22 at an angle and the emission surface 24 of the sputtering target 22, from one end side of the substrate 3B supported by the supporting member 50, to partly shield the space between the design surface 4 of the substrate 3B and the emission surface 24 of the sputtering target 22. In other words, between the design surface 4 of the substrate 3B and the emission surface 24 of the sputtering target 22, the substrate 3A is located on one end side in the width direction of the substrate 3B where the substrate 3B is supported by the supporting member 50.

That is, as shown in FIG. 7(a), immediately after rotation driving of the rod-like rotation axis 40 is started concurrently with start of sputtering operation, no other substrate 3 enters the space α between the design surface 4 of the substrate 3B and the emission surface 24 of the sputtering target 22. Therefore, at this time, the sputtering particles emitted from the emission surface 24 of the sputtering target 22 uniformly reach the entire face of the design surface 4 of the substrate 3B.

Specifically, as shown by the thin line, the thick line and the medium line in FIG. 7(a), sputtering particles emitted from the entire width in the width direction of the emission surface 24 of the sputtering target 22 reach the design surface 4 of the substrate 3B, in approximately the same amount, at one end portion 58 which is a first end portion in the width direction situated on the side of the clamp portion 56 of the supporting member 50, an other end portion 60 which is a second end portion in the width direction situated on the opposite side to the clamp portion 56, and a middle portion 62 in the width direction. In other words, the region in the emission surface 24 from which sputtering particles that reach the one end portion 58, the other one end portion 60 and the middle portion 62 in the width direction in the design surface 4 of the substrate 3B is referred to as a region $W_1$ extending over the entire width in the width direction.

Then, all of the substrates 3A to 3L are rotated integrally with the rod-like rotation axis 40 by a predetermined angle in the direction shown by the arrow in FIG. 7(a) (clockwise direction) so as to arrive at the position shown in FIG. 7(b), and thus a tip end part on the side opposite to the clamp 56 of the substrate 3A positioned adjacently backward of the substrate 3B in the rotation direction enters the space α between the design surface 4 of the substrate 3B on which the coating film 6 is to be formed first and the emission surface 24 of the sputtering target 22.

At this time, as shown by the thick line and the medium line in FIG. 7(b), among the sputtering particles emitted from the entire width in the width direction of the emission surface 24 of the sputtering target 22, all of the sputtering particles flying straight toward the other one end portion 60 and the middle portion 62 in the width direction of the design surface 4 of the substrate 3B will reach the other one end portion 60 and the middle portion 62 of the design surface 4 of the substrate 3B, respectively, without being hindered at the tip end part of the substrate 3A having entered the space α.

Meanwhile, as shown by the thin line in FIG. 7(b), among the sputtering particles emitted from the entire width in the width direction of the emission surface 24 of the sputtering target 22, the sputtering particles flying straight toward the one end portion 58 (the portion on the side where the substrate 3A having entered the space α is located) in the width direction of the design surface 4 of the substrate 3B will be partly adhered at the top of the tip end part of the substrate 3A having entered the space α, whereby the part of the sputtering particles are prevented from reaching the one end portion 58 of the design surface 4.

That is, the region in the emission surface 24 from which sputtering particles reaching the other one end portion 60 and the middle portion 62 in the width direction in the design surface 4 of the substrate 3B are emitted is referred to as a region $W_1$ extending over entire width of the width direction of the emission surface 24. Meanwhile, the region of the emission surface 24 from which sputtering particles reaching the one end portion 58 in the width direction of the design surface 4 of the substrate 3B are emitted is referred to as a region $W_2$ excluding one end portion in the width direction of the emission surface 24. The size of the region $W_2$, is smaller than that of the region $W_1$ from which the sputtering particles to the other one end portion 60 and the middle portion 62 of the design surface 4 are emitted.

Consequently, the amount of the sputtering particles to reach the other one end portion 60 and the middle portion 62 of the design surface 4 of the substrate 3B is made larger by a predetermined amount than the amount of the sputtering particles to reach the one end portion 58 of the design surface 4.

Further, all of the substrates 3A to 3L are further rotated integrally with the rod-like rotation axis 40 by a predetermined angle in the direction shown by the arrow in FIG. 7(b) so as to arrive at the position shown in FIG. 7(c), and thus the tip end part of the substrate 3A on the side opposite to the clamp 56 enters the space α with a larger entry amount.

At this time, as shown by the thick line in FIG. 7(c), among the sputtering particles emitted from the entire width in the width direction of the emission surface 24 of the sputtering target 22, all of the sputtering particles flying straight toward the other one end portion 60 in the width direction of the design surface 4 of the substrate 3B will reach the other one end portion 60, without being hindered by the tip end part of the substrate 3A having entered the space α.

Meanwhile, as shown by the medium line in FIG. 7(c), among the sputtering particles emitted from the entire width in the width direction of the emission surface 24 of the sputtering target 22, the sputtering particles flying straight toward the middle portion 62 in the width direction of the design surface 4 of the substrate 3B are partly prevented from reaching the middle portion 62 of the design surface 4 by the tip end part of the substrate 3A having entered the space α.

As shown by the thin line in FIG. 7(c), among the sputtering particles emitted from the entire width in the width direction of the emission surface 24 of the sputtering target 22, the sputtering particles flying straight toward the one end portion 58 in the width direction of the design surface 4 of the substrate 3B are also partly prevented from reaching the one end portion 58 of the design surface 4 by the tip end part of the substrate 3A having entered the space α. As described above, the entry amount of the tip end part of the substrate 3A on the side opposite to the clamp 56 into the space α is made larger as the rotation amount of each of the substrates 3 increases. Therefore, the amount of sputtering particles that are prevented from reaching the one end portion 58 of the design surface 4 by the part of the substrate 3A having entered the space α is larger than that in the case where the substrate 3B is located at the rotation position as shown in FIG. 7(b), and is larger than that of the sputtering particles that are prevented from reaching the middle portion 62 of the design surface 4.

In other words, the region in the emission surface 24 which emits sputtering particles reaching the other one end portion 60 of the design surface 4 of the substrate 3B is referred to as a region $W_1$ extending over the entire width in the width direction. Meanwhile, the region in the emission surface 24 which emits sputtering particles reaching the middle portion 62 in the design surface 4 is referred to as a region $W_3$ excluding the one end portion in the width direction of the emission surface 24 which is smaller than the above $W_1$. Further, the region of the emission surface 24 which emits sputtering particles reaching the one end portion 58 in the design surface 4 is referred to as a region $W_4$ excluding the one end portion and the middle portion in the width direction of the emission surface 24, which is smaller than the above $W_3$.

As a result, in the width direction of the design surface 4 of the substrate 3B, the sputtering particles reach the other one end portion 60 in the largest amount, the middle portion 62 in the second largest amount, and the one end portion 58 in the smallest amount.

Successively to this, each of the substrates 3 is further rotated around the rod-like rotation axis 40, and the tip end side part of the substrate 3A enters the space α more largely. Accordingly, the amount of sputtering particles prevented from reaching the design surface 4 of the substrate 3B gradually increase from the other one end portion 60 toward the one end portion 58 of the design surface 4. When the substrate 3A completely shields the space between the design surface 4 of the substrate 3B and the emission surface 24 of the sputtering target 22 at last, sputtering particles are completely prevented from reaching the entire face of the design surface 4 of the substrate 3B.

Thus, in this case, in the formation of the coating film 6 on the design surface 4 of the substrate 3B, by conducting sputtering operation while each of the substrate 3 is rotated around the rod-like rotation axis 40 integrally therewith, amount of the sputtering particles emitted from the emission surface 24 of the sputtering target 22 and reaching the design surface 4 of the substrate 3B gradually increases from the one end portion 58 toward the other one end portion 60 in the width direction of the design surface 4. As a result, amount of the sputtering particles to be deposited on the design surface 4 of the substrate 3B also gradually increases from the one end portion 58 toward the other one end portion 60 in the width direction of the design surface 4. As a result, on the design surface 4 of the substrate 3B, the coating film 6 made of a metallic film which is the same material as the sputtering target 22 is formed sufficiently thin as a whole, with the film thickness gradually increasing from the one end portion 58 to the other one end portion 60 in the width direction of the design surface 4. In this way, the automobile interior part 2 in which metallic decoration is made on the design surface 4 having the structure as shown in FIGS. 1 and 2 is obtained.

In the present embodiment, rotation of the substrate 3B and sputtering operation are concurrently started when the substrate 3B is located at the position shown in FIG. 7(a) where design surface 4 thereof is opposed to the emission surface 24 of the sputtering target 22 at an angle. However, in the case where rotation of the substrate 3B and sputtering operation are started when the substrate 3B is located at a position where its design surface 4 is not opposed to the emission surface 24 of the sputtering target 22, for example, at the same position as the position of the substrate 3L shown in FIG. 7(a), sputtering particles emitted from the entire width in the width direction of the emission surface 24 of the sputtering target 22 will be substantially uniformly reached the entire face of the design surface 4 without being interfered by other substrate 3 and the like, until the substrate 3B arrives at the position shown in FIG. 7(a) from its rotation starting position (the same position as the position of the substrate 3L shown in FIG. 7(a)) to the position shown in FIG. 7(a). Therefore, in the case of rotation within such a rotation range, the coating film 6 is formed to have a substantially uniform thickness on the design surface 4 of the substrate 3B.

In the present operation in which rotation of the substrate 3B and the sputtering operation are started concurrently when the substrate 3B is located at the position shown in FIG. 7(a), sputtering particles emitted from the entire width in the width direction of the emission surface 24 of the sputtering target 22 reach the design surface 4 of the substrate 3A without being hindered by the other substrate 3 and the like, until the substrate 3A serving as a shielding member of the substrate 3B arrives at the same position as the position of the substrate 3B as shown in FIG. 7(a), from the position shown in FIG. 7(a) via the position shown in FIG. 7(c) by integrated rotation with the substrate 3B. Therefore, during the rotation within such a rotation range, the coating film 6 is formed to have a substantially uniform thickness on the design surface 4 of the substrate 3A.

Thereafter, integral rotation of each of the substrates 3A to 3L with the rod-like rotation axis 40 is further continued while the sputtering operation is continued. In such a case, the substrate 3L serves as a shielding member until the substrate 3A arrives at the position where the substrate 3L positioned adjacent backward of the substrate 3A in the rotation direction of the substrate 3A completely shields a space between the design surface 4 of the substrate 3A and the emission surface 24 of the sputtering target 22 from the same position as the position of the substrate 3B shown in FIG. 7(a), whereby the coating film 6 is formed on the design surface 4 of the substrate 3A to have such a film thickness that gradually increases from one end portion, which is the clamp portion 56 side of the supporting member 50a, to the other end portion in the width direction of the design face 4. Thereafter, in the same manner as described above, by integrated rotation of each of the substrates 3A to 3L with the rod-like rotation axis 40, the coating film 6 having such a film thickness that gradually increases from one end portion, which is the clamp portion 56 side of the supporting member 50a, to the other end portion in the width direction of the design surface 4 is formed also on the design surface 4 of the substrates 3C to 3L in addition to the substrate 3A and the substrate 3B. In this manner, the automobile interior part 2 in which metallic decoration is made on the design surface 4 is obtained successively. In this case, of the two substrates 3 that are adjacent to each other in the rotation direction, the substrate 3 that is positioned backward in the rotation direction serves as a shielding member that prevents sputtering particles from reaching the design surface 4 of the substrate 3 that is positioned ahead in the rotation direction.

After the coating films 6 is formed on the respective design surfaces 4 of all of the substrates 3A to 3L supported by the one supporting device 38 located at the operation position (after the supporting device 38 is rotated 360° around the rod-like rotation axis 40), the rotation stage 34 is rotated by 60° to locate another supporting device 38 at the operation position. Thereafter, in the same manner as described above, the supporting device 38 located at the operation position is rotated 360° around the rod-like rotation axis 40, so that the coating film 6 is formed on the design surface 4 of all of the substrates 3A to 3L supported by the supporting device 38. In this manner, all of the supporting devices 38 are located in turn one by one at the operation position, where they are rotated 360° around the rod-like rotation axis 40. As a result, the coating film 6 is formed on the design surface 4 of every substrate 3 supported by every supporting device 38 to have the same thickness as that of the above, and all of these substrates 3 can be processed into the automobile interior parts 2.

In the formation of the coating film 6 on the design surface 4 of every substrate 3 in this manner, sputtering particles also reach the back face which is opposite to the design surface 4 of each substrate 3 and lateral surfaces of the substrate 3. However, as described above, all of the surfaces of the substrate such as the back face and lateral faces, excluding the design surface 4 of each substrate 3, are fully masked. Therefore, the coating film 6 will not be directly formed on a face other than the design surface 4 during the formation of the coating film 6 onto the design surface 4 of each substrate 3. This masking will be removed after each substrate 3 is removed from the supporting device 38 (supporting member 50).

Further, during the formation of the coating film 6 on the design surfaces 4 of all of the substrates 3A to 3L, which is supported by the supporting device 38, by rotation of the supporting device 38 located at the operation position as described above, sputtering particles reach the design surface 4 of some of the substrates 3 respectively supported by the supporting devices 38 located at positions other than the operation position. However, the amount is so small that the sputtering particles deposited on the design surface 4 of each substrate 3 before the supporting device 38 is located at the operation position have little influence on thickness of the coating film 6 of the design surface 4 of each substrate 3 formed when the supporting device 38 is located at the operation position.

In this manner, by using the sputtering apparatus 10 of the present embodiment, it is possible to advantageously obtain the automobile interior part 2 in which, the coating film 6 made of a metallic film which is the same material as the sputtering target 22 is formed to be sufficiently thin as a whole on the design surface 4 of every substrate 3 supported by each supporting device 38. In addition, the thickness of the coating film gradually increases from the one end portion 58 to the other one end portion 60 in the width direction of the design surface 4. As a result, in the automobile interior part 2 obtained in this manner, not only metallic surface having sufficient shine and sharply angular edge 8 is more sufficiently expressed, but also improvement in appearance and gradually changing metallic shine are effectively realized by the gradation effect of the coating film 6 having the thickness gradually increasing.

In the present embodiment, the plurality of substrates 3 (design surfaces 4) supported by the supporting device 38 are attached to the clamp portions 56 provided in tip ends of the plurality of arm portions 54 extending radially and horizontally from the rod-like rotation axis 40 extending in the vertical direction. As a result, formation operation of the coating film 6 by sputtering onto the design surface 4 is proceeded while each of these substrates 3 is rotated integrally with the supporting device 38 around the rod-like rotation axis 40 extending in the vertical direction at the position other than the position where the substrate 3 is located. Therefore, in the process of forming such a coating film 6, the amount of displacement of the design surface 4 in the circumferential direction along with rotation around the rod-like rotation axis 40 gradually increases from the side of the one end portion 58 in the width direction where the distance to an axial center of the rod-like rotation axis 40 is short, toward the side of other end portion 60 where the distance to an axial center of the rod-like rotation axis 40 is large.

As a result, sputtering particles floating around the design surface 4 of the substrate 3 being rotated are adhered or deposited on the design surface 4 in an amount which gradually increase from the side of the one end portion 58 toward the side of the other one end portion 60 in the width direction of the design surface 4. Also this makes it possible to form the coating film 6 on the design surface 4 of the substrate 3 having such a thickness that gradually increases from the side of the one end portion 58 to the side of the other one end portion 60 in the width direction.

In the present embodiment, the plurality of substrates 3 supported by the supporting device 38 are rotated around the rod-like rotation axis 40 integrally therewith while the respective design surfaces 4 are located to extend radially from the rod-like rotation axis 40, whereby the coating film 6 is sequentially formed on the design surface 4 of each of the substrates 3. As a result, a plurality of automobile interior parts 2 having a surface with metallic decoration are produced with efficiency one after another.

In the present embodiment, the shielding member partly shields the space between the design surface 4 of the substrate 3 (corresponding to substrate 3B in FIGS. 7(a) to 7(c)) on which the coating film 6 is to be formed and the emission surface 24 of the sputtering target 22, thereby preventing sputtering particles from reaching the design surface 4. The shielding member is constituted by the substrate 3 (corresponding to the substrate 3A in FIGS. 7(a) to 7(c)) that is adjacent to the substrate 3 on which the coating film 6 is to be formed. In other words, among the three substrates 3 that are supported by the supporting device 38 and adjacent to each other in the circumferential direction of the rod-like rotation axis 40, the substrate 3 located between two substrate 3 serves as a shielding member. Accordingly, the supporting device 38 supports only the plurality of substrates 3. Any special shielding member that is separate from the substrate 3 and that is exclusively for preventing sputtering particles from reaching the design surface 4 of the substrate 3 on which the coating film 6 to be formed is not supported by the supporting device 38. As a result, an objective automobile interior part 2 can be efficiently produced.

In the present embodiment, the shielding member is configured by the substrate 3 that is adjacent to the substrate 3 on which the coating film 6 is to be formed, and the substrate 3 serving as the shielding member is rotated around the rod-like rotation axis 40 integrally together with the substrate 3 on which the coating film 6 is to be formed. As a result, unlike the case where rotation of the substrate 3 serving as the shielding member is unrotatable, for example, an amount of the sputtering particles to be reached the design surface 4 of the substrate 3 on which the coating film 6 is to be formed can be more flexibly controlled for particular portion of the design surface 4 by changing the distance between the substrate 3 serving as the shielding member and the substrate 3 on which the coating film 6 is to be formed by the rotation of each of these substrates 3. Consequently, in the automobile interior part 2 obtained by the formation of the coating film 6, more varied gradation effects can be obtained.

In the present embodiment, the plurality of substrates 3 supported by the supporting device 38 are arranged so that the respective design surfaces 4 extend radially from the rod-like rotation axis 40. As a result, the plurality of substrates 3 are supported with respect to the supporting device 38 while being arranged regularly in a smaller arrangement space, and hence more substrates 3 can be supported by one supporting device 38. Further, on the respective design surfaces 4 of the plurality of substrates supported in this manner, the coating film 6 is formed one after another. As a result, a plurality of automobile interior parts 2 each having a surface with metallic decoration are sequentially produced with efficiency. In addition, it is advantageously prevented that variation in film thickness of the coating film 6 arises between different substrates 3.

In the present embodiment, a plurality of supporting devices 38 are provided in the rotation stage 34. In association with rotation of the rotation stage 34, each of the plurality of supporting devices 38 is sequentially located one by one at the operation position, and on the respective design surfaces 4 of every substrate 3 supported by the supporting device 38 located at the operation position, the coating film 6 is formed. As a result, more automobile interior parts 2 can be efficiently and automatically produced.

Hereinafter, the test conducted by the present inventors will be described in detail to confirm that the sputtering apparatus having a structure according to the present invention reliably exerts the excellent feature as described above.

Specifically, initially, a sputtering apparatus having the structure as shown in FIGS. 3 and 4 was prepared. Then, as shown in FIGS. 5 and 6, each of the two supporting members 50a and 50b on the upper side and the lower side of the supporting device 38 was made to support twelve substrates 3. Thereafter, as shown in FIG. 7(a), each of the substrates 3B supported by the upper and the lower supporting member 50a and 50b was located so that the respective design surface 4 was opposed to the emission surface 24 of the sputtering target 22 at an angle.

Next, as shown in FIGS. 7(b) and 7(c), a predetermined voltage was applied to the sputtering target 22 from a power supply unit (not shown) connected thereto, while the substrate 3B was rotated around the rod-like rotation axis 40, whereby sputtering operation was conducted, and the coating film 6 was formed on the design surface 4 of the substrate 3B. The sputtering operation was carried out according to a known glow discharge sputtering method using a stainless metal plate as the sputtering target 22 and using argon gas as the reaction gas.

Thereafter, film thickness of the coating film 6 formed on the design surface 4 of the substrate 3B was measured at three portions by a known method. The three portions include an edge of the one end portion 58 which is close to the rod-like rotation axis 40 in the width direction, an edge of the other one end portion 60 which is distant from the rod-like rotation axis 40 in the width direction, and the middle portion 62 which is 39.5 mm from the edge of the other one end portion 60 toward the side of the one end portion 58. The width of the design surface 4 of the substrate 3B was 52 mm.

As a result, thickness of the coating film 6 was 60 angstroms at the one end portion 58 of the design surface 4 of the substrate 3B, 75 angstroms at the middle portion 62, and 110 angstroms at the other one end portion 60. From these measurements value, thickness gradient of the coating film 6 was calculated to be about 1 angstroms/mm.

This clearly shows that by using the sputtering apparatus 10 having the structure according to the present invention, the coating film 6 is formed on the design surface 4 of the substrate 3B in such a manner that thickness thereof is thin enough as a whole and has a film thickness gradually increasing from the one end portion 58 toward the other one end portion 60 in the width direction of the design surface 4.

While the present invention has been described in detail, for the illustrative purpose only, it is to be understood that the invention is not limited to the details of the illustrated embodiment.

For example, in the above embodiment, the plurality of substrates 3 supported by the supporting device 38 are located in such a condition that the respective design surfaces 4, which are coating surfaces, are radially extended out from the rod-like rotation axis 40, so that all of the design surfaces 4 of the substrates 3 are opposed to the emission surface 24 of the sputtering target 22 at the same angle of inclination when they are located at the same rotation position. However, an angle of inclination with respect to the emission surface 24 of the design surface 4 of at least one substrate 3 may be made different from an angle of inclination with respect to the emission surface 24 of the design surface 4 of other substrates 3. In this manner, gradation of the film thickness of the coating film 6 formed on the design surface 4 of each substrate 3 can be changed in various way depending on the angle of inclination with respect to the emission surface 24 of the design surface 4. As a result of this, more varied gradation effects can be achieved in finally obtained decorated products.

In the above embodiment, during the period from starting to end of forming operation of the coating film 6 on the design surface 4 of one substrate 3, the substrate 3 is rotated around the rod-like rotation axis 40 at a constant speed. However, the forming operation of the coating film 6 may be executed in such a manner that the rotation speed of the substrate 3 is changed, the substrate 3 is intermittently rotated, or the rotation is stopped, for example, at the rotation position in FIG. 7(*c*), during the period from starting to end of forming operation of the coating film 6 on the design surface 4 of one substrate 3.

In the above embodiment, every time either one of the six supporting devices 38 is located at the operation position, rotation of the rotation stage 34 is suspended. However, when the rotation speed of the rotation stage 34 is slow speed, the rotation stage 34 may be continuously rotated without stopping rotation of the rotation stage 34 regardless of the position of each supporting device 38. It goes without saying that, also at this time, the rod-like rotation axis 40 of each supporting device 38 is rotated concurrently. As a result, structure of the rotary mechanism of the rotation stage 34 can be simplified, and the operation of forming the coating film 6 on the substrate 3 can be more efficient.

When the design surface 4 of the substrate 3 is provided not only on one side in the thickness direction thereof, but also on both sides or the entire surface thereof, masking on the surface of the substrate 3 is omitted. Further, for example, in the case where surfaces of both sides in the thickness direction of the substrate 3 are rendered the design surfaces 4 and the coating films 6 are formed on both of these two design surfaces 4, 4 in such a manner that the film thickness gradually increases from the one end portion 58 to the other one end portion 60 in the width direction of each design surface 4, while the substrate 3 is rotated in the clockwise direction around the rod-like rotation axis 40 in the formation of the coating film 6, one of the substrates 3 that is positioned adjacent backward of the above substrate 3 in the rotation direction serves as a shielding member when the coating film 6 is formed onto the design surface 4 which is directed toward backward in the rotation direction of the substrate 3. Further, one of the substrates 3 that is positioned adjacent frontward in the rotation direction of the substrate 3 on which the coating film 6 is to be formed serves as a shielding member when the coating film 6 is formed onto the design surface 4 which is directed toward frontward in the rotation direction of the substrate 3 on which the coating film 6 is to be formed.

It is to be understood that the arrangement of the substrates 3 supported by the supporting device 38 is not limited to the arrangement in which the substrates 3 extend radially from the rod-like rotation axis 40.

Between adjacent ones of a plurality of substrates 3 supported by the supporting device 38, an independent shielding member which is not the substrate 3 and on which the coating film 6 does not need to be formed may be disposed.

It is also possible that the mechanism for rotating the rotation stage 34 and the rod-like rotation axis 40, respectively, are omitted. Instead, for example, a displacement mechanism for slidely-displacing at least either one of the substrate 3 and the shielding member (including the one implemented by the substrate 3 other than the substrate 3 on which the coating film 6 is to be formed, and a member independent from the substrate 3 on which the coating film 6 does not need to be formed) is provided. The formation operation of the coating film on the coating face of the substrate 3 may be carried out while the substrate 3 or the shielding member is slidely-displacing so that the shielding member enters the space between the coating surface (design surface 4) of the substrate 3 on which the coating film 6 is to be formed and the emission surface 24 of the sputtering target 22.

In the above embodiment, the design face 4 of the substrate 3 is located to be opposed to the emission surface 24 at an angle, in which the design surface 4 is inclined at a predetermined angle in the horizontal direction from the position parallel to the emission surface 24 of the sputtering target 22. Thus, for example, the design surface 4 of the substrate 3 may be located to be opposed to the emission surface 24 at an angle such that the design face 4 is inclined at a predetermined angle in the vertical direction from the position parallel with the emission surface 24 of the sputtering target 22.

Figure 8:
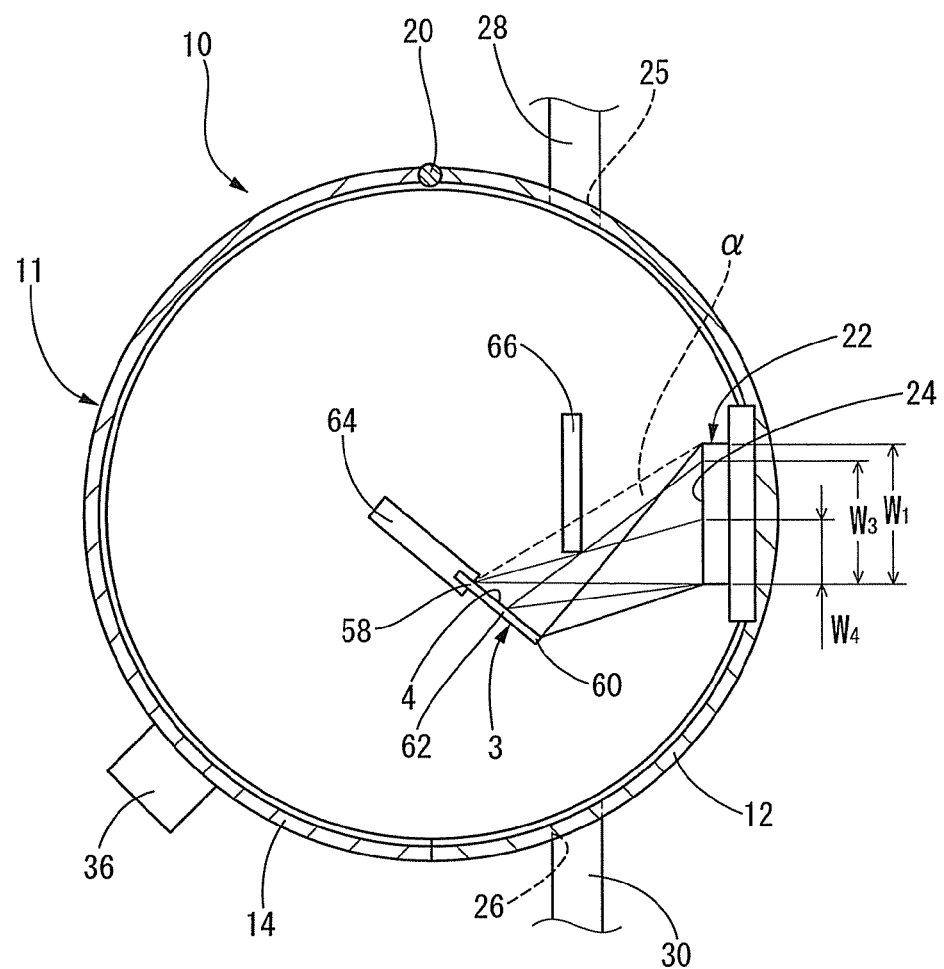
FIG. 8 is a view corresponding to FIG. 4, showing another embodiment of a sputtering apparatus having a structure according to the present invention.

Further, in the present invention, for example, the structure shown in FIG. 8 may be employed. Specifically, a supporting device 64 is fixedly provided inside the vacuum chamber 11, and the supporting device 64 undisplaceably support one substrate 3 such that the design surface 4, which is a coating surface, is positioned to be opposed to the emission surface 24 of the sputtering target 22 at an angle. Meanwhile, a shielding member 66 which is a member independent from the substrate 3, on which the coating film 6 does not need to be formed, is made to enter the space α between the design surface 4 of the substrate 3 and the emission surface 24 of the sputtering target 22, and is fixedly disposed. In that condition, the sputtering operation may be carried out to form the coating film 6 on the design surface 4 of the substrate 3.

At this time, as shown in FIG. 8, an entry amount of the shielding member into the space α is appropriately adjusted so that the sizes of the regions in the emission surface 24 of the sputtering target 22 from which sputtering particles reaching the other one end portion 60, the middle portion 62 and the one end portion 58 in the width direction of the design surface 4 of the substrate 3 are emitted, are made different from each other. For example, as with FIG. 7(*c*), the entry amount is adjusted so that a region $W_1$ extends over entire width in the width direction of the emission surface 24 for the other one end portion 60, a region $W_3$ extends smaller than $W_1$ for the middle portion 62, and a region $W_4$ extends further smaller than $W_3$ for the one end portion 58. As a result, thickness of the coating film 6 formed on the design surface 4 of the substrate 3 gradually increases from the one end portion 58 to the other one end portion 60 in the width direction. As for the embodiment shown in FIG. 8 and FIG. 9 which will be described later, the regions and the members having the same structures as those in the above embodiment is denoted by the same reference numerals as in FIGS. 1 to FIGS. 7(*a*) to 7(*c*), and detailed explanation thereof will be omitted.

When the substrate 3 and the shielding member 66 are disposed inside the vacuum chamber 11 in the condition as shown in FIG. 8, the shielding member 66 may be slide-displaceable, for example, by a cylinder mechanism (not shown) to make the amount of the shielding member 66 to be entered into the space α variable.

Figure 9:
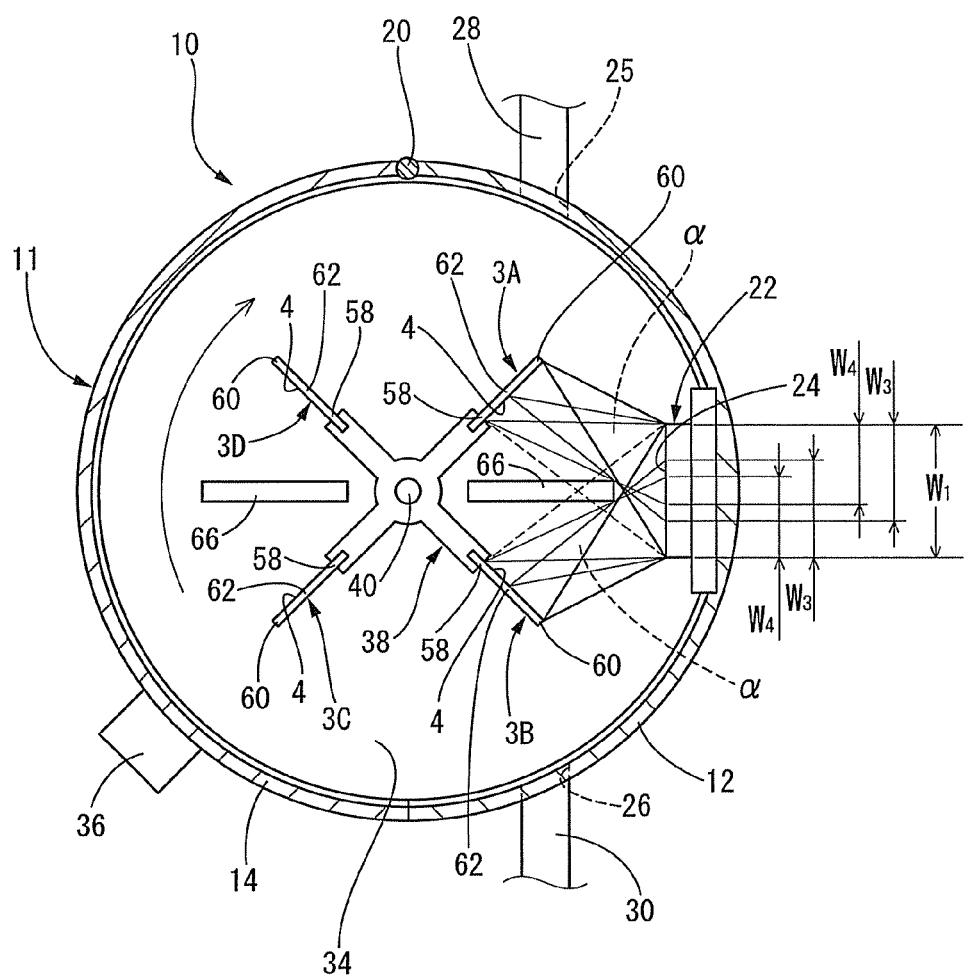
FIG. 9 is a view corresponding to FIG. 4, showing a still another embodiment of a sputtering apparatus having a structure according to the present invention.

Further, in the present invention, for example, the structure as shown in FIG. 9 may be employed. Described more specifically, on the rotation stage 34 inside the vacuum chamber 11, one supporting device 38 is disposed in such a manner that it is rotatable in the direction indicated by the arrow in FIG. 9 around the rod-like rotation axis 40 positioned coaxially with the rotation stage 34. In addition, an appropriate number of, in this example, four substrates 3A to 3D are supported by the supporting member 38 in such a manner that the respective design surfaces 4 thereof extend radially from the rod-like rotation axis 40, and rotated integrally with the supporting device 38. Here, the number of substrates 3 supported by the supporting member 38 may be one, although a plurality of number of more than two is desired. Then, in such a supported condition, among the four substrates 3A to 3D, the respective design surfaces 4 of two adjacent substrates in the circumferential direction of the rod-like rotation axis 40 (substrate 3A and substrate 3B, and substrate 3C and substrate 3D) are located to direct oppositely in the rotation direction of each substrate 3. Between the respective design surfaces 4 of the two substrates 3 whose design surfaces 4 direct oppositely, each one of shielding member 66 which is independent member from the substrate 3 is located and fixed on the rotation stage 34. The position where each of the shielding members 66 is disposed is the position where a part of each shielding member 66 enters the space: α between the design surface 4 and the emission surface 24 in the condition that the design surface 4 of each substrate 3 is located to be opposed to the emission surface 24 of the sputtering target 22 at an angle. At this time, each of the shielding members 66 is not located at all positions between the adjacent substrates 3.

When such a structure is employed, for example, initially, sputtering operation is carried out in the condition that the substrate 3A and the substrate 3B are located at the positions shown in FIG. 9. As a result, on the respective design surfaces 4 of the substrate 3A and the substrate 3B, the coating films 6 are concurrently formed. Then, the rotation stage 34 is rotated 180° around its center axis, and the substrate 3C is located at the position of the substrate 3A shown in FIG. 9, and the substrate 3D is located at the position of the substrate 3B shown in FIG. 9. Thereafter, the same sputtering operation as the sputtering operation carried out to form the coating films 6 onto the respective design surfaces 4 of the substrate 3A and the substrate 3B is carried out. As a result, onto the respective design surfaces 4 of the substrate 3C and the substrate 3D, the coating films 6 are concurrently formed. In the formation of the coating film 6 by sputtering on the design surface 4 of each substrate 3, rotation of the supporting device 38 may be suspended. Alternatively, within the range of rotation angle in which the supporting device 38, the substrate 3A and the substrate 3B supported by the same will not contact the shielding member 66 located between the substrate 3A and the substrate 3B, the supporting device 38 may be rotated in both of forward and reverse directions or either one of the forward and reverse directions around the rod-like rotation axis 40.

As described above, in the formation of the coating film 6 onto the design surface 4 of each substrate 3, the shielding member 66 enters the space α, as shown in FIG. 9, so that each of the regions in the emission surface 24 of the sputtering target 22 which emits the sputtering particles that reach the one end portion 58, the middle portion 62 and the other one end portion 60, respectively in the width direction of the design surface 4 of each substrate 6 has the size different from one another, like the embodiment shown in FIG. 8, for example. As a result, thickness of the coating film 6 formed on the design surface 4 of the substrate 3 gradually increases from the one end portion 58 to the other one end portion 60 in the width direction. Further, as described above, when the substrate 3 is rotated together with the supporting device 38 in a predetermined rotation angle range, at the time of the sputtering operation, the sputtering particles floating around the substrate 3 are adhered to the design surface 4 of the substrate 3. As a result, the coating film 6 is formed onto the design surface 4 of the substrate 3 more effectively. Furthermore, when the substrate 3 is rotated, the amount of displacement of the design surface 4 in the circumferential direction is gradually increased from the side of the one end portion 58 in the width direction where the distance to the axial center of the rod-like rotation axis 40 is short, toward the side of the other one end portion 60 where the distance to the axial center of the rod-like rotation axis 40 is long. As a result, the sputtering particles floating around the design surface 4 is adhered on the design surface 4 in an amount gradually increasing from the side of the one end portion 58 to the side of the other one end portion 60 in the width direction of the design surface 4. Consequently, film thickness of the coating film 6 formed on the design surface 4 of the substrate 3 is gradually increased more reliably from the one end portion 58 to the other one end portion 60 in the width direction.

The rod-like rotation axis 40 may extend in the horizontal direction.

Apart from whether the substrate 3 is displaceable or not, in the structure different from those in FIGS. 8 and 9, the shielding member may be configured to enter the space α between the design surface 4 of the substrate 3 and the emission surface 24 of the sputtering target 22 by displacing the shielding member independently of the substrate 3 or by displacing the substrate 3 while the position of the shielding member is fixed.

The entry amount of the shielding member into the space α between the design surface 4 of the substrate 3 and the emission surface 24 of the sputtering target 22 may be appropriately determined depending on the required film thickness, gradation and the like of the coating film 6.

It is to be understood that the structure for rotating the substrate 3 around the rod-like rotation axis 40 integrally therewith, and the structure for rotating the rotation stage 34 are not limited to those exemplified above.

The rod-like rotation axis 40 and the rotation stage 34 may be rotated by the same rotation driving means. As a result, cost reduction due to a reduction in parts can be expected.

The number of supporting members 50 provided in the supporting device 38, and the number of substrates 3 supported by the supporting member 50, or the supporting structure to the supporting member 50 of the substrate 3 may also be appropriately changed.

In addition, in the present embodiment, specific examples were given for the sputtering apparatus used for forming a coating film on a substrate providing an automobile interior part, an automobile interior part in which a coating film is formed on the substrate by sputtering, and a method for forming a coating film by sputtering employed for obtaining such an automobile interior part, to which the present invention is applied. However, it is to be understood that the present invention may be advantageously applied to any of the sputtering apparatus used for forming a coating film on various substrates, a decorated product in which a coating film is formed on a substrate by sputtering, and a method for forming a coating film by sputtering employed for obtaining such a decorated product. As for the sputtering method executed by using the apparatus of the present invention, any known methods such as glow discharge sputtering method, ion beam sputtering method and the like may be employed.

It is to be understood that the present invention may be embodied with various other changes and modifications which may occur to those skilled in the art, without departing from the spirit and scope of the invention.

What is claimed is:

1. A sputtering apparatus comprising: a plurality of substrates each having a coating surface on which a coating film is to be formed; a sputtering target having an emission surface from which sputtering particles are emitted by sputtering; and a vacuum chamber having the plurality of substrates and the sputtering target therein, the sputtering particles emitted from the sputtering target being deposited on the coating surface of at least one substrate of the plurality of substrates to form the coating film, the apparatus further comprising:

at least one supporting means disposed in the vacuum chamber and supporting the at least one substrate of the plurality of substrates such that the coating surface thereof is opposed to the emission surface of the sputtering target at an angle; and at least one shielding member for preventing part of the sputtering particles emitted from the emission surface from reaching the coating surface, the at least one shielding member being disposed in the vacuum chamber so as to correspond to the at least one substrate in a state in which the at least one shielding member is positioned in a space between the coating surface of the at least one substrate and the emission surface of the sputtering target, wherein the coating surface includes a first end portion and a second end portion which are located oppositely on the at least one substrate and an amount of the sputtering particles reaching the coating surface of the at least one substrate gradually increases from the first end portion toward the second end portion of the coating surface, wherein the at least one supporting means is rotatable around a rotation axis extending in one of a vertical direction and a horizontal direction at a position different from a position where the at least one substrate supported by the at least one supporting means is disposed, the at least one substrate being rotatable around the rotation axis together with the at least one supporting means, wherein the at least one supporting means includes a plurality of arm portions, the plurality of arm portions being arranged so as to be spaced apart from each other with a predetermined distance therebetween in a circumferential direction around the rotation axis, the plurality of substrates being supported by the plurality of arm portions such that the coating surfaces thereof are extended radially from the rotation axis, and wherein a displacement amount of the coating surface of the at least one substrate in a circumferential direction gradually increases from the first end portion toward the second end portion of the coating surface, the first end portion being positioned on a rotation axis side and the second end portion being positioned on a side opposite to the rotation axis side.

2. The sputtering apparatus according to claim 1, wherein the at least one shielding member includes an opposing surface which faces the emission surface of the sputtering target at an angle, and wherein the at least one shielding member is disposed between the plurality of substrates adjacent to each other in a circumferential direction in a state in which the opposing surface extends radially from the rotation axis.

3. The sputtering apparatus according to claim 1, wherein the at least one shielding member constitutes an adjacent substrate of the plurality of substrates supported by the at least one supporting means.

4. A sputtering apparatus according to claim 1, further comprising a rotation body in the vacuum chamber which is rotatable around an axis extending in one of a vertical direction and a horizontal direction, wherein the at least one supporting means comprises a plurality of supporting means, each of the plurality of supporting means being disposed on the rotation body so as to rotate around each of the plurality of rotation axes disposed on the rotation body.

* * * * *